Nov. 21, 1961 R. H. BAKER 3,010,031

SYMMETRICAL BACK-CLAMPED TRANSISTOR SWITCHING CIRCUIT

Filed Oct. 24, 1956

INVENTOR.
RICHARD H. BAKER

BY

Edward D. Thomas
AGENT

United States Patent Office 3,010,031

Patented Nov. 21, 1961

3,010,031

SYMMETRICAL BACK-CLAMPED TRANSISTOR SWITCHING CIRCUIT

Richard H. Baker, Bedford, Mass., assignor, by mesne assignments, to Research Corporation, New York, N.Y., a corporation of New York Filed Oct. 24, 1956, Ser. No. 617,966
9 Claims. (Cl. 307—88.5)

The present invention relates generally to transistor switching circuits for use in digital data-processing equipment and in particular to transistor circuit configurations employing complementary symmetry and back-clamping techniques operable at high speed with stability, reliability and efficiency.

Prior art transistor switching circuits have been disclosed which have considerable utility despite certain inherent limitations. One approach to transistorized switching circuits has been the substitution of transistors for vacuum tubes in the well-known Eccles-Jordan circuit with due regard for the changed impedance levels involved. Circuits of this type have been devised which are comparatively stable in operation but which are relatively insensitive and which have low efficiency judged by the ratio of signal power output to power supply drain. Transistor switching circuits have also been developed which use the transistor essentially as a relay device. Although relays are normally four terminal devices in which the nature of the load circuit has no effect on the input signal or holding circuit, the transistor is a three terminal device in which the current through the transistor to supply a load circuit affects the holding power of the device. Therefore, such relay type transistor switching circuits are found to possess good sensitivity but have poor stability since the amplitude of input voltage to trigger the circuit is affected by the load on the output circuit. Moreover, the relay type transistor switching circuits operate at low power levels and have poor efficiency judged by the ratio of signal power output to power supply drain.

The limitations of the prior art circuits arise in part from a failure to realize the advantages inherent in the important transistor characteristics. The transistor is essentially a very efficient device both voltagewise and powerwise. In most of the present transistor switching circuits, a high percentage of the useful output power from the transistor is lost in the load resistors and bias resistors. The present invention contemplates symmetrical circuit arrangements using both p-n-p and n-p-n type junction transistors in a balanced configuration where each type can serve as a load resistor for the other thereby significantly reducing the standby power dissipated in this area. Further, an additional gain in system power efficiency is secured by arrangements involving feedback so that power is taken from the power supplies according to the power demand at the output. Since the emitter, base and collector barriers are p-n junction diodes, the transistors may be cut off with relatively low voltages, usually on the order of 0.1 volt for germanium units. Consequently the sharp low voltage cutoff characteristics permit circuits that are efficient since the collector signal voltage swing can be made very nearly equal to the supply voltage magnitude.

The primary object of the present invention is to provide transistor switching circuits which have a high conversion efficiency of D.C. power supply drain to A.C. signal power output.

Another object of the invention is to secure maximum system efficiency by drawing power from the power supply according to the needs of the load.

Another object of the invention is to provide circuit arrangements which are insensitive to component and transistor parameters and which do not require standby load resistors.

Still another object is to provide switching circuits having fast rise and fall times.

These and other objects of the present invention will be better understood from the detailed description and the accompanying drawings, in which.

Figures 1, 2, 3, 4, 5:
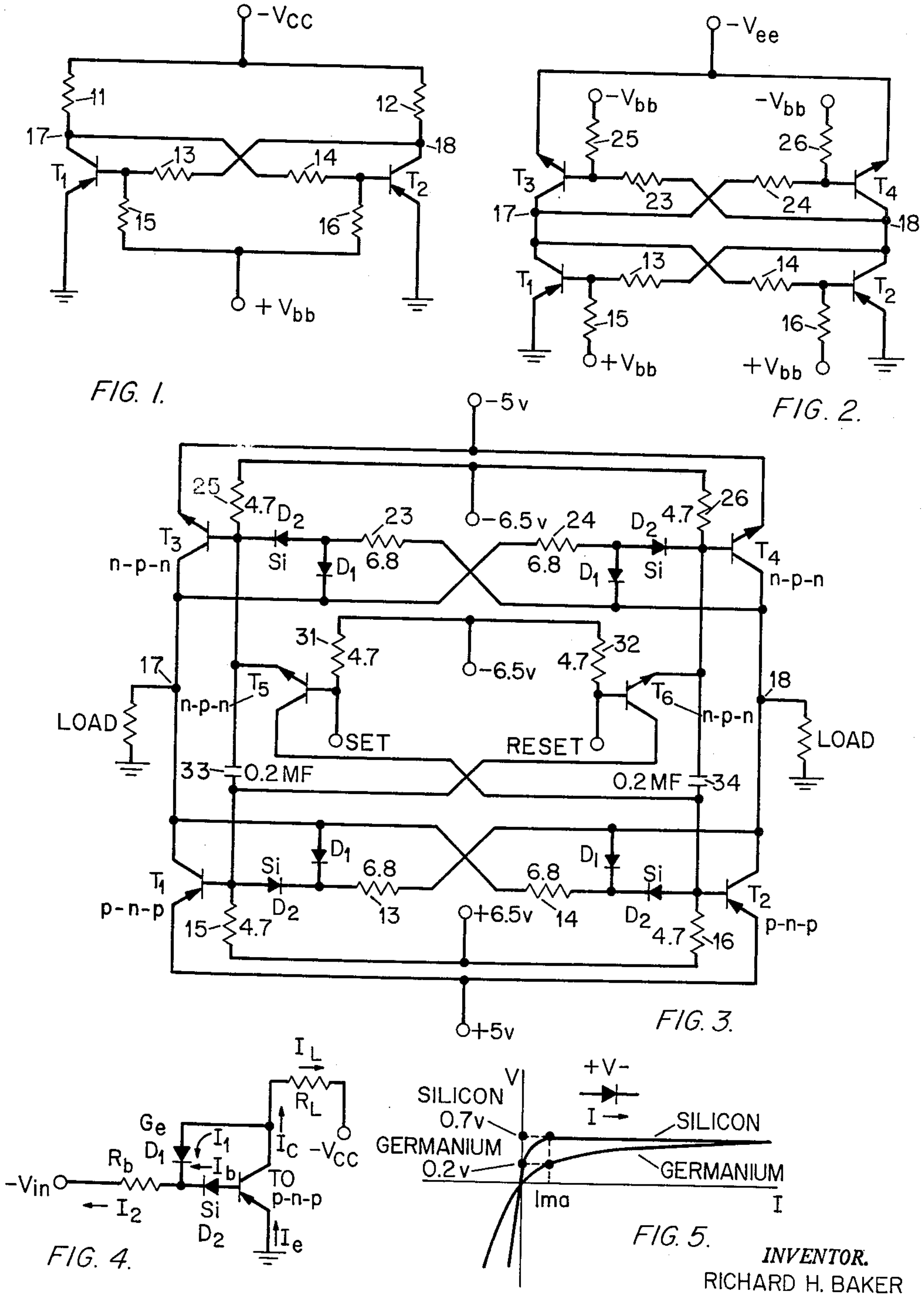
FIGURE 1 represents a circuit embodying a principle of the invention.
FIGURE 2 represents a circuit embodying one form of the invention.
FIGURE 3 represents a circuit embodying another form of the invention.
FIGURE 4 is a circuit illustrating the principle of the back-clamping feedback loop.
FIGURE 5 is a graph of silicon and germanium diode characteristics.

Referring to FIGURE 1, certain of the principles embodied in the invention are illustrated by the behavior of the simplified bistable circuit shown therein. Two p-n-p type transistors $T_1$ and $T_2$ are shown with grounded emitters. The collector of $T_1$ is biased negatively through resistor 11 connected to $-V_{cc}$ and the collector of $T_2$ is biased to the same potential through resistor 12. The base of $T_1$ is coupled to the collector of $T_2$ through resistor 13 and the base of $T_2$ is coupled to the collector of $T_1$ through resistor 14. A positive bias is applied from $+V_{bb}$ to the base of $T_1$ through resistor 15 and to the base of $T_2$ through resistor 16.

Assuming conduction of transistor $T_1$, the collector current flowing through resistor 11 will lower the collector potential. The potential difference across resistors 14 and 16 will be reduced and the potential at the base of transistor $T_2$ will be driven positive as the potential at the collector of transistor $T_1$ nears ground potential. Positive potential at the base of transistor $T_2$ drives $T_2$ to cutoff. At cutoff there can be no emitter current from transistor $T_2$ and the current flow through resistor 12 will be a minimum and the potential of the collector of $T_2$ will approach $-V_{cc}$. Therefore, the potential difference across resistors 13 and 15 is such that the potential at the base of transistor $T_1$ is negative with respect to ground, the bias condition required to maintain $T_1$ conducting. Now, if the base of transistor $T_2$ is driven negative by the application of a trigger pulse, by circuit connections not shown, transistor $T_2$ conducts, the collector current flowing through resistor 12 lowers the potential difference across resistors 13 and 15 and the potential at the base of transistor $T_1$ is driven positive biasing $T_1$ to cutoff. In turn, transistor $T_1$ has no emitter current and the reduction in current through resistor 11 establishes a potential difference across resistors 14 and 16 to hold the base of transistor $T_2$ negative with respect to ground and maintain conduction of $T_2$. The circuit of FIGURE 1, therefore, has two stable states of conduction.

The voltage at point 17 is seen to be switched from a value near ground level with $T_1$ conducting to a value near $-V_{cc}$ when the conduction of the circuit is shifted by triggering $T_2$ to conduction. The voltage at point 18 behaves in a similar manner. Consequently, the voltage at point 17, for example, can be applied to an external load circuit returned to $-V_{cc}$ and current is available for the load from the collector of the conducting transistor up to the maximum collector current output of the particular type transistor used. The circuit is seen to draw power from the supply $-V_{cc}$ according to the power demand of the load. In the absence of an external load the drain on the power supply is essentially the power dissipation of the resistors since the power dissipation in the transistors is low.

The difficulty with the circuit of FIGURE 1 is that the voltage levels applied to an external load are not fixed but are dependent upon the leakage current of the transistors at cutoff and the power dissipated in the internal resistors shunting the load may be an appreciable part of the total power drain on the power supply, particularly at low output power levels. Further, for rapid switching, i.e. for fast fall time when the transistor is turned off, resistors 11 and 12 must be made relatively small.

A circuit configuration that circumvents these disadvantages is shown in FIGURE 2 in which n-p-n type transistors $T_3$ and $T_4$ in a cross coupled arrangement are substituted effectively for resistors 11 and 12 of FIGURE 1 respectively. Assuming that transistor $T_1$ is conducting, the potential of point 17 is near or at ground potential and the voltage drop across resistors 14 and 16 places the base of transistor $T_2$ at a positive potential with respect to the emitter of transistor $T_2$ and hence transistor $T_2$ is driven to cutoff. The high impedance of transistor $T_2$ at cutoff in series with resistors 23 and 25 biases the base of transistor $T_3$ negative with respect to the emitter of transistor $T_3$ and hence transistor $T_3$ is also driven to cut-off. The low impedance of transistor $T_1$ changes the potential drop across resistors 24 and 26 so that the base of transistor $T_4$ is positive with respect to the emitter of transistor $T_4$ so that $T_4$ is driven to conduction. As before, if a negative trigger pulse is applied to the base of transistor $T_2$, by circuit means not shown, $T_2$ can be biased to conduction and in turn transistors $T_1$ and $T_4$ are driven to cutoff and transistor $T_3$ is biased for conduction. Thus, the circuit is stable in two different states of conduction and points 17 and 18 can be switched alternately between the voltage levels of $-V_{ee}$ and ground.

Now, if an external load circuit is connected, for example, between point 18 and $-V_{ee}$, and transistor $T_2$ is conducting, substantially all of the collector current of transistor $T_2$ is fed to the load since the impedance of transistor $T_4$ shunting the load is very high when transistor $T_4$ is biased to cutoff. Further, it is noted that the low impedance of conducting transistor $T_2$ is between the collector of transistor $T_4$ and ground, a condition which promotes rapid switching of the circuit. Finally, the standby power is low under no load conditions because the power taken from the supply is approximately equal to the dissipation of the resistors which are in the transistor base circuits, hence the conversion efficiency is high, namely, the ratio of signal power output to power supply drain.

However, the conventional three regions junction transistor is a relatively slow device compared with the vacuum tube triode. Unlike a vacuum tube where the passage of electrons from cathode to plate is aided by strong electric fields, the transport of carriers, electrons or holes, in a semiconductor is by diffusion. Hence, in transistor networks, in addition to the integrative effects due to shunt capacitances, there is the effect of carrier transient time between emitter and collector plus the effect of hole storage or saturation delay when the transistor is operated in the saturation mode as described above. To some extent this difficulty is overcome by employing large transistor overdrive and the difficulty may be minimized by triggering all four transistors simultaneously. Also, operation of the transistors in nonsaturating circuitry eliminates delays due to hole storage and achieves the maximum switching speed.

The circuit of FIGURE 3 is a complete operating circuit diagram based on the configuration of FIGURE 2 with the modifications discussed above with respect to operation of transistors in the nonsaturating mode and simultaneous triggering. Circuit values are indicated on the drawing in numerals smaller than the reference numerals adjacent the element. For capacitors, the values are in microfarads indicated as MF. Resistor values are in kilohms (thousands of ohms). All p-n-p transistors are General Electric Co. 4JD1A23, all n-p-n transistors are General Electric Co. 4JD2A6, all germanium diodes are type 2085, all silicon diodes, indicated by Si, are type SG22.

In view of the completeness of detail afforded by FIGURE 3 and the foregoing discussion of FIGURE 2, only a brief description of the modifications shown in circuit of FIGURE 3 follows.

Since the circuit of FIGURE 3 is symmetrical, it may be observed that although the voltage level at the base of transistor $T_1$ and at the base of transistor $T_3$ shift as conduction is shifted from one stable state to the second stable state, the voltage difference between the respective base electrodes remains constant. Consequently, if a capacitor, such as 33, is connected between the base of transistor $T_1$ and the base of transistor $T_3$, there will be a constant potential across its terminals at all times. Therefore, the presence of capacitor 33 has no effect on the speed with which the circuit shifts from one stable state to another since there will be no charging current associated with capacitor 33 except for trigger transients. The same conditions apply to capacitor 34 connected between the bases of transistors $T_2$ and $T_4$.

In the absence of a trigger pulse, transistors $T_5$ and $T_6$ are biased to cutoff. Assuming transistors $T_1$ and $T_4$ to be conducting and a positive trigger pulse is applied to the terminal marked Set, transistor $T_5$ is thereby driven to conduction. This has the effect of connecting the base of transistor $T_2$ to the base of transistor $T_3$ for the time duration of the trigger pulse at a voltage level substantially midway between 6.5 volts and −6.5 volts or ground level. The base of transistor $T_2$ is, therefore, negative with respect to its emitter, and $T_2$ is driven to conduction while the base of transistor $T_3$ is positive with respect to its emitter and also is driven to conduction. For the time interval of the trigger pulse, no change in the potential across capacitors 33 and 34 can occur so that the base of transistor $T_1$ is driven positive with respect to its emitter, and hence transistor $T_1$ is biased toward cutoff while the base of transistor $T_4$ is driven negative and transistor $T_4$ is also biased toward cutoff. All four transistors are thus simultaneously triggered to shift their respective states of conduction by this transistor cross-coupled trigger circuit. Obviously, the same analysis is applied to a positive trigger pulse connected to the terminal marked Reset to restore the circuit to the initial state of conduction, i.e. transistors $T_1$ and $T_4$ conducting at low impedance.

The back-clamping feedback loop consisting of diodes $D_1$ and $D_2$ connected between collector electrode and base electrode of transistors $T_1$, $T_2$, $T_3$ and $T_4$ acts to prevent saturation of the transistors. The behavior of the diodes to accomplish this result is best explained by reference to FIGURE 4 which shows the essential elements of the circuit configuration and by reference to FIGURE 5 which shows the pertinent diode characteristics. In FIGURE 4, with the p-n-p transistor $T_0$ conducting, the collector current $I_c$ is related to the base current $I_b$, $I_c=\beta I_b$; and to the emitter current $I_e$, $I_c=\alpha I_e$; and $I_e=I_b+I_c$. It is also evident that the collector current can divide, a portion being fed to the load resistor $R_L$ and another portion being fed through germanium diode $D_1$ so that $I_c=I_L+I_1$. The voltage across the collector and base electrodes of Transistor $T_0$ is, therefore, the difference of the forward voltage drops of diodes $D_2$ and $D_1$ respectively, i.e. $V_{cb}=V_{D2}-V_{D1}$. The current $I_2$ flowing through base resistor $R_b$ is the sum of the base current $I_b$ and the current through germanium diode $D_1$. Under the conditions of no load, i.e. $I_L=0$, the base current is insufficient to supply $I_2$ according to the relation $$I_2 \approx \frac{V_{in}-V_{D_2}}{R_b}$$

accordingly, most of current $I_2$ is supplied by collector current flowing through $D_1$, denoted as $I_1$, and $$I_2=I_c+\frac{I_c}{\beta}$$

Under the conditions of maximum load, $$I_c=I_L \text{ and } I_b=\frac{I_c}{\beta}$$

is so large that no current flow occurs through germanium diode $D_1$ with the result $$I_2=\frac{I_c}{\beta}$$

Further, diode $D_2$ is polarized for conduction at all times so that the characteristics of the diode under reverse bias conditions is unimportant for use in the back-clamped feedback loop.

The transistor circuits of FIGURES 2 and 3 are very stable with respect to variations in transistor parameters, components, and voltage supplies because of the well-known stabilizing effects of feedback. The circuits have low transistor dissipation and operate without internal standby load resistors so that the circuits have very high efficiency in terms of ratio of signal output power to transistor dissipation and D.C. to A.C. conversion, i.e. signal power output to power supply drain. The circuits have fast rise and fall times because all transistors can be triggered simultaneously with large transient overdrive driving switching and the output voltage levels are switched between clamped levels. The major advantage of the nonsaturated circuit of FIGURE 3 over the saturated configuration of FIGURE 2 is through decreased switching time in the absence of hole storage delays.

If silicon transistors are used at $T_1$, $T_2$, $T_3$ and $T_4$, the nonsaturated circuit of FIGURE 3 does not require the four silicon diodes $D_2$ since the silicon emitter-base diode characteristics provide the 0.7 volt "knee" and cooperates with the germanium diode $D_1$ to establish the desired operating conditions below the level of saturation.

It is also obvious that conventional diode trigger circuits can be employed and that the present circuits can be modified to accept a commutative trigger input or to operate from gate and clock pulses without affecting the essential operating characteristics disclosed with respect to FIGURES 2 and 3.

What is claimed is:

1. A bistable transistor switching circuit comprising, a source of energizing potentials, a pair of current paths connected to said source, each of said paths consisting of a p-n-p transistor serially connected to a n-p-n transistor by a common collector lead with the emitters of said transistors polarized for conduction and a capacitor coupling between the bases of said transistors, resistance means cross coupling the base of each transistor to the collector lead in the other path, a feed-back loop including at least one diode connected between collector and base of each transistor, and means for biasing the base of each transistor from said source whereby two stable states exist with the n-p-n transistor in one of said pair of paths and the p-n-p transistor in the other of said pair of paths conducting with low impedance to drive the remaining transistor in each path to a state of relatively high impedance, and means for coupling trigger pulses to the bases of said transistors to shift conduction from one stable state to the other.

2. A bistable transistor switching circuit comprising, a source of energizing potentials, a pair of symmertical current paths, each path consisting of a p-n-p transistor connected in series with a n-p-n transistor by a common collector lead with the emitters of said transistors connected to said potential source with proper polarity for conduction, resistance means cross coupling the base of each transistor in each of said paths to the collector lead in the other of said paths, means including a feed-back loop between collector and base for biasing the bases of each of said transistors from said potential source whereby two stable states exist with the p-n-p- transistor in one of said paths and the n-p-n transistor in the other of said paths conducting below saturation to drive the remaining transistor in each path toward cutoff, and means for coupling trigger pulses to the bases of said transistors to shift from one stable state to the other stable state.

3. A bistable transistor switching circuit comprising, a source of energizing potentials of positive and negative polarities, first and second symmetrical parallel current paths, each path consisting of a p-n-p transistor serially connected to a n-p-n transistor by a common collector lead with the emitters of said transistors being connected to said potential source with proper polarity for conduction, a feed back loop including at least one diode connected between collector and base of each transistor, resistance means for cross coupling the base of each transistor in said first path to said collector lead in said second path and the base of each transistor in said second path to said collector lead in said first path, means for biasing the bases of each transistor by potentials from said source whereby a first stable state exists with the n-p-n transistor in said first path and the p-n-p transistor in said second path conducting at low impedance below saturation to bias the remaining transistors to conduct at high impedance below cutoff and a second stable state exists with the p-n-p transistor in said first path and the n-p-n transistor in said second path conducting below saturation to bias the remaining transistors to conduct at high impedance below cutoff.

4. A bistable transistor switching circuit comprising, a source of energizing potentials of positive and negative polarities, first and second symmetrical parallel current paths, each path consisting of a p-n-p transistor serially connected to a n-p-n transistor by a common collector lead with the emitters of said transistors being connected to said potential source with proper polarity for conduction, and a capacitor directly connected between the bases of said transistors in each current path, resistance means for cross coupling the base of each transistor in said first path to said collector lead in said second path and the base of each transistor in said second path to said collector lead in said first path, means including a feed-back loop between collector and base for biasing the bases of each transistor by potentials from said source whereby a first stable state exists with the n-p-n transistor in said first path and the p-n-p transistor in said second path conducting at low impedance below saturation to bias the remaining transistors to conduct at high impedance below cutoff and a second stable state exists with the p-n-p transistor in said first path and the n-p-n transistor in said second path conducting at low impedance below saturation to bias the remaining transistors to conduct at high impedance below cutoff, and means for applying trigger pulses to the bases of said transistors and to initiate conduction in said nonconducting transistors and to terminate conduction in said conducting transistors to shift from said first stable state to said second stable state.

5. A bistable switching circuit as defined in claim 4 wherein said means for applying trigger pulses to the bases of said transistors comprises an n-p-n type transistor with the emitter electrode coupled to the base electrodes of said transistors in one of said first and second paths and the collector electrode coupled to the base electrodes of said transistors in the other of said first and second paths while the base electrode is connected resistively to a negative potential at said source to be biased normally to cutoff, the application of a positive trigger pulse to said base electrode serving to drive said cutoff transistor to conduction thereby biasing said transistors in said first and second paths to shift the state of conduction thereof simultaneously.

6. A bistable switching circuit as defined in claim 1 wherein said means for applying trigger pulses to the bases of said transistors comprises independent set and reset trigger circuits, said set trigger circuit including an n-p-n transistor with the emitter electrode thereof coupled to the base electrodes of said transistors in the first of said current paths and the collector electrode thereof coupled to the base electrodes of said transistor in said second current path, said reset trigger circuit including an n-p-n transistor with the emitter electrodes thereof coupled to the base electrodes of said transistors on said second current path and the collector electrode thereof coupled to the base electrodes of said transistors in said first current paths, the base electrodes of said transistors in said set and reset circuits being biased negative with respect to the respective emitter electrodes to be normally biased to cutoff, the alternate application of positive trigger pulses to the base electrode of said transistors of said set and reset circuits serving to shift said switching circuit from said first stable state to said second stable state and back to said first stable state.

7. A bistable transistor switching circuit comprising, a source of energizing potentials of positive and negative polarities, first and second symmetrical parallel current paths, each path consisting of a p-n-p transistor serially connected to a n-p-n transistor by a common collector lead with the emitters of said transistors being connected to said potential source with proper polarity for conduction, and capacitor coupling means connected between the bases of said transistors in each current path, resistance means for cross coupling the base of each transistor in said first path to said collector lead in said second path and the base of each transistor in said second path to said collector lead in said first path, a feedback loop including at least one diode connected between collector and base of each transistor, means for biasing the bases of each transistor by potentials from said source whereby a first stable state exists with the n-p-n transistor in said first path and the p-n-p transistor in said second path conducting to bias the remaining transistors to high impedance and a second stable state exists with the p-n-p transistor in said first path and the n-p-n transistor in said second path conducting to bias the remaining transistors to high impedance, and means for applying trigger pulses to the bases of said transistors to initiate conduction in said nonconducting transistors and to terminate conduction in said conducting transistors to shift from said first stable state to said second stable state.

8. A bistable transistor switching circuit as defined in claim 7 wherein said feedback loop for each of said transistors includes a silicon diode connected between the transistor base electrode and said resistance cross coupling means and a germanium diode connected between the transistor collector electrode and the junction of said silicon diode and said resistance means, said silicon diode and said germanium diode being polarized for conduction during conduction of said transistor.

9. A bistable transistor switching circuit comprising a source of energizing potentials, a pair of p-n-p transistors and a pair of n-p-n transistors, each of said transistors having emitter, collector and base electrodes, a first current path formed by a first p-n-p transistor connected to a first n-p-n transistor by a common collector lead, the emitter electrode of said p-n-p transistor being connected to a positive potential at said source and the emitter electrode of said n-p-n transistor being connected to a negative potential at said source, a second current path formed by the second of said pair of p-n-p transistors connected to the second of said pair of n-p-n transistors by a common collector lead, the emitter electrode of said second p-n-p transistor being connected to said positive potential and the emitter electrode of said second n-p-n transistor being connected to said negative potential thereby forming a pair of symmetrical current paths, a capacitor connected from base electrode to base electrode between transistors in each of said paths, resistance means coupling the base electrode of each p-n-p transistor to the collector electrode of the other p-n-p transistor of said pair of p-n-p transistors and the base electrode of each n-p-n transistor to the collector electrode of the other n-p-n transistor of said pair of n-p-n transistors, a feedback loop including at least one diode connected between the collector electrode and the base electrode of each transistor, means for biasing the base electrodes of said transistors from said source whereby conduction of said first p-n-p transistor and said second n-p-n transistor at a relatively low impedance biases said first n-p-n transistor and said second p-n-p transistor to a relatively high impedance in a first stable state and conduction of said first n-p-n transistor and said second p-n-p transistor to a relatively high impedance in a first stable state and conduction of said first n-p-n transistor and said second p-n-p transistor to a relatively high impedance in a second stable state, and means for applying trigger pulses to the base electrodes of said transistors to shift said circuit from one stable state to the other.

References Cited in the file of this patent

UNITED STATES PATENTS

| | | |
|---|---|---|
| 2,948,820 | Bothwell | Aug. 9, 1960 |

OTHER REFERENCES

Warnocks Circuit, in "Handbook of Semiconductor Electronics," by Hunter. McGraw-Hill, published Oct. 15, 1956, pages 15–48.